(12) United States Patent
Johnson

(10) Patent No.: US 7,285,758 B2
(45) Date of Patent: Oct. 23, 2007

(54) RAPID THERMAL PROCESSING LAMP AND METHOD FOR MANUFACTURING THE SAME

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 359 days.

(21) Appl. No.: 10/450,154

(22) PCT Filed: Dec. 12, 2001

(86) PCT No.: PCT/US01/44708

§ 371 (c)(1),
(2), (4) Date: Oct. 29, 2003

(87) PCT Pub. No.: WO02/49395

PCT Pub. Date: Jun. 20, 2002

(65) Prior Publication Data
US 2004/0099651 A1  May 27, 2004

Related U.S. Application Data

(60) Provisional application No. 60/254,573, filed on Dec. 12, 2000.

(51) Int. Cl.
F27B 5/14 (2006.01)
F27D 11/06 (2006.01)
H05B 6/02 (2006.01)
H05B 11/00 (2006.01)

(52) U.S. Cl. .............. 219/411; 219/405; 219/411; 219/635; 392/416; 392/427

(58) Field of Classification Search ........... 219/411, 219/390, 405, 634, 635; 392/416, 418; 118/724, 118/725, 50.1; 315/57, 62, 248, 267; 313/344, 313/156, 157, 158
See application file for complete search history.

(56) References Cited

U.S. PATENT DOCUMENTS

| | | | | |
|---|---|---|---|---|
| 3,535,481 A | * | 10/1970 | Korb | 219/635 |
| 3,699,298 A | * | 10/1972 | Briody | 219/634 |
| 4,263,336 A | * | 4/1981 | Thompson et al. | 427/588 |
| 4,545,327 A | * | 10/1985 | Campbell et al. | 118/719 |
| 4,983,804 A | * | 1/1991 | Chan et al. | 219/616 |
| 5,183,985 A | * | 2/1993 | Sidky et al. | 219/645 |
| 5,294,778 A | * | 3/1994 | Carman et al. | 219/385 |
| 5,571,436 A | * | 11/1996 | Gregg et al. | 219/635 |
| 5,800,621 A | * | 9/1998 | Redeker et al. | 118/723 AN |
| 5,905,343 A | | 5/1999 | McCamant | |
| 6,232,585 B1 | * | 5/2001 | Clothier et al. | 219/620 |
| 6,917,163 B2 | * | 7/2005 | Baarman | 315/51 |

FOREIGN PATENT DOCUMENTS

| JP | 60-165714 A | * | 8/1965 |
|---|---|---|---|
| JP | 2000242108 A | * | 9/2000 |

* cited by examiner

Primary Examiner—Joseph M. Pelham
(74) Attorney, Agent, or Firm—Oblon, Spivak, McClelland, Maier & Neustadt, P.C.

(57) ABSTRACT

A method and system for inductively coupling energy to a heating filament (7A', 7B', 7C', 7A, 7B, 7C) in a thermal processing environment. By applying AC power to a coil antenna (11) and inductive coupling to a filament (e.g., a halogen lamp filament), a number of connections that are subject to fatigue is reduced, thereby increasing the reliability of the heater (2A, 2B). Such an environment can be used to process semiconductor wafers (3) and liquid crystal displays.

28 Claims, 4 Drawing Sheets

RAPID THERMAL PROCESSING LAMP AND METHOD FOR MANUFACTURING THE SAME

CROSS-REFERENCE TO RELATED APPLICATIONS

This application is a National Stage of International Application No. PCT/US01/44708 filed Dec. 12, 2001, which claims the benefit of U.S. Provisional Application No. 60/254,573 filed Dec. 12, 2000. The present invention is related to the following patent applications: "Multi-Zone Resistance Heater," U.S. Provisional Ser. No. 60/156,595 filed Sep. 29, 1999; and, entitled "Multi-Zone Resistance Heater," filed Sep. 18, 2000. The contents of all of those applications are incorporated herein by reference.

BACKGROUND OF THE INVENTION

1. Field of the Invention

The present invention is directed to an apparatus for rapidly heating a substrate to be processed, and more particularly to an apparatus for heating during a rapid thermal processing of a semiconductor wafer or a liquid crystal display.

2. Discussion of the Background

Rapid Thermal Processing (RTP) and epitaxy in semiconductor chip manufacturing are processes where a heating method (e.g., an optical heating method) is used to ramp up the temperature of a semiconductor wafer rapidly, hold at a steady state high temperature for a period of time, and then ramp down rapidly. RTP allows the wafer to be heated very quickly to its activation temperatures (e.g., at least 1000 degrees C.). The activation temperature is the temperature at which a corresponding processing step (e.g., deposition, implantation, diffusion, removal or formation of key materials) is stabilized. The temperature and the period of time at which that temperature is maintained must be executed precisely for each processing step. Overheating can cause dopants to permeate subjacent layers, and under-heating can produce layers with uncontrolled characteristics.

RTP in semiconductor processing has been used for annealing of semiconductor wafers. One such application of RTP is to anneal the wafer after ion implantation. The RTP heaters used for these purposes must have a high uniformity; that is, the temperature must be uniform across the entire wafer surface. In most known RTP heaters, the solid angle of the filament—which is the solid angle subtended by the filament when viewed from the wafer surface—is extremely small, on the order of a tenth of a radian. The view factor area then is defined as the area projected on the wafer by the solid angle of the filament (i.e., the solid angle of the filament multiplied by the distance between the filament and the wafer). When the total solid angle for the total wafer coverage is $4\pi$ radians, a solid angle of a tenth of a radian covers only about 1% of the wafer. Reflectors outside a container wall of quartz only extend the radiation field for the short wavelength radiation field.

Known RTP heaters have a relatively short lifetime because those lamps have a physical connection between their filaments and their power supplies. Such lamps are sealed on the ends, and the wires connecting the filaments are brought to the outside world to be physically connected to a power supply. This physical connection causes a high failure rate due to the filament input/output connection failure, which in turn is due to the stresses built up at the interface as a result of the different thermal expansion rates of the metals in the connection, during normal lamp operation. Known tungsten halogen lamps are formed into nested group of rings acting as an RTP heater. One such embodiment includes smaller rings toward the center and larger rings toward outside edge.

Additional information about RTP systems can be found in: (1) U.S. Pat. No. 5,715,361 entitled "Rapid thermal processing high-performance multi-zone illuminator for wafer backside heating", issued to CVC Products, Inc., Fremont, Calif., on Feb. 3, 1998; (2) U.S. Pat. No. 4,857,689, entitled "Rapid thermal furnace for semiconductor processing", issued to High Temperature Engineering Corporation, Danvers, Mass. on Aug. 15, 1989; (3) U.S. Pat. No. 5,504,831, entitled "System for compensating against wafer edge heat loss in rapid thermal processing", issued to Micron Semiconductor, Inc., Boise, Id. on Apr. 2, 1996; (4) U.S. Pat. No. 5,719,991, entitled "System for compensating against wafer edge heat loss in rapid thermal processing", issued to Micron Technology, Inc., Boise, Id. on Feb. 17, 1998; (5) U.S. Pat. No. 5,601,366, entitled "Method for temperature measurement in rapid thermal process systems", issued to Texas Instruments Incorporated, Dallas, Tex. on Feb. 11, 1997; and (6) U.S. Pat. No. 5,881,208, entitled "Heater and temperature sensor array for rapid thermal processing thermal core", issued to Sematech, Inc., Austin, Tex. on Mar. 9, 1999.

SUMMARY OF THE INVENTION

It is an object of the present invention to provide an RTP lamp with a lower failure rate and/or cost than known lamps.

It is a further object of the present invention to increase the view factor area, or the solid angle of the filaments, of an RTP lamp so the radiation field can cover a large area of the wafer, with an increased uniformity of the radiation field. In one such embodiment, the present invention preferably forms lamp elements into the shape of large area rings. Moreover, the larger the filament is, the larger the solid angle is, so the larger the view factor area is and the higher the uniformity of the radiation field is. For systems having a shorter distance from the heat source to the wafer, this solid angle becomes increasingly important.

It is yet a further object of the present invention to increase a lamp emitting area, so that the radiated power (i.e., the product of the emitting area and the temperature of the emitting area) is increased. In one such embodiment, the present invention preferably includes an adjustable distribution of power with high uniformity.

It is another object of the present invention to provide a lamp including filaments that are not physically connected to the power supply, to other filaments or to the outside world. To achieve this object, the present invention preferably inductively powers each individual filament (e.g., a tungsten ring) that is sealed inside its own cavity. Preferably at least one fluid cooled conduction cup is used to isolate the induction coils. Preferably the heating of the induction coils is reduced by utilizing a gold-plated plate with multiple slots which allow the RF field to leak out.

It is an additional object of the present invention to provide a vacuum window in the processing chamber. To achieve this object, the present invention preferably uses the upper quartz plate of the lamp as a vacuum window since it is sufficiently rigid to support the vacuum and yet thin enough to pass a very high intensity light.

It is a further object of the present invention to integrate the lamp into an upper injection plate for fast processing (e.g., heating of wafer to 1000 DEG C. in less than 5 seconds and with uniformity less than +/−3 DEG C.).

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
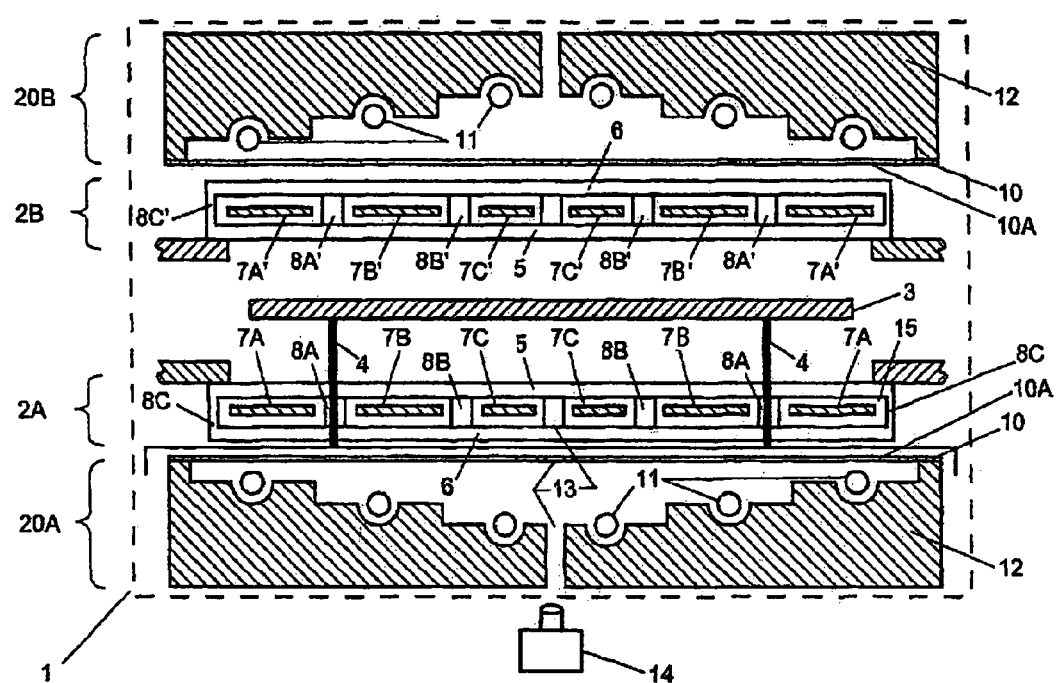
FIG. 1 is a cross-sectional view of a heater according to a first embodiment of the present invention.

Referring now to the drawings, wherein like reference numerals designate identical or corresponding parts throughout the several views, FIG. 1 illustrates a first embodiment of the present invention. The apparatus includes a chamber 1 to which heated lamp assemblies 2a and 2b (e.g., RF induction heated lamp assemblies) are fitted. A substrate 3 (e.g., a silicon wafer or LCD panel) to be heat-treated is located substantially midway between the two lamp assemblies (2a and 2b) on pins 4 (e.g., quartz pins). (As would be apparent to one skilled in the art, the present invention may selectively and alternately illuminate (1) the top side, (2) the bottom side or (3) both sides of the substrate 3.) Alternately, a single lamp assembly can be used. The lamp assemblies 2a and 2b include a first isolation plate 5, a second isolation plate 6, and at least one of (1) filament rings 7a, 7b, 7c, 7a', 7b' and 7c', (2) a ring of filament coils, (3) a wavy filament structure, or (4) a ring made of weaving wires. The use of a coil or wavy structure may decrease the build-up of stresses in the ring, leading to increased life expectancy. Filaments can be fabricated from any or a combination of: tungsten, tungsten alloy, platinum, Kanthal, Nikrothal and Alkrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe); however, tungsten is preferred for the filament.

In a preferred embodiment, the first and second isolation plates (5 and 6) are formed from quartz. Such isolation plates may also be referred to hereinafter as a substrate-side plate 5 and a coolant-side plate 6, respectively. Spacers 8a, 8b, 8a', and 8b' (e.g., preferably made of the same material as the isolation plates) are provided to separate the filament rings and to provide strength to the structure so that it is capable of withstanding a vacuum. The first and second plates, however, should not be so thick as to limit the heating ability of the lamps. Outer ring 8c encloses and provides structural integrity to the lamp assemblies (2a and 2b). "Hairpins" 9 (FIG. 2) provide support for the filament rings 7 to prevent the filament rings 7 from touching the isolation plates (5 and 6). Such hairpins may be made of different metals or different glasses. In one embodiment, a flat tungsten ring element uses small diameter tungsten wire itself as conical support springs equally spaced about the periphery of the heater coil. In an alternate embodiment, a wavy tungsten filament includes a conical tungsten wire spring/coil which encircles the heating element as is done for support in conventional lamp filaments. The outer circular diameter fits within the quartz spacing and the inner circular diameter fits around the filament diameter. Small tungsten tripods may be employed. Any material compatible with the high temperature environment and quartz tungsten/halogen materials, and any configuration capable of supporting the heating element and minimizing contact between the heating element and the quartz encasement is acceptable. Others include alumina or molybdenum posts.

A shield 10 (e.g., an RF-, a heat- or a combination RF/heat-shield) is fitted between the heated lamp assemblies (2a and 2b) and corresponding cooled induction coil assemblies 20a and 20b. The cooled RF induction coils 11 are mounted in a cooled structure 12 (e.g., a water- or air-cooled cup) (preferably made of a conductive material (e.g., OFHC copper, plated with gold)). In one embodiment, the shield 10 is made of a piece of metal plate (e.g., a gold plate) with a radial pattern of slots 10a therein. In a second embodiment, an isolation plate (e.g., a quartz plate) is coated with a metal (e.g., gold-plated on the side towards the lamp) and formed with a radial pattern of slots; hence comprising the shield 10. The (radially) slotted shield 10 serves two primary functions, namely, (1) the radial pattern of slots in the shield 10 will permit the RF field to penetrate so that it will inductively couple power with the tungsten rings 7, while (2) the RF/heat shield 10 will keep excessive heat from the lamp assemblies 2 from reaching the RF induction coils 11 or the cooling structure 12 by simply reducing the area and view factors through which the tungsten heating rings 7 can radiate to the cooled inductive coil assembly 20. Moreover, the shield 10 reflects radiant energy to the substrate 3. Measurement openings 13 are provided in the filament ring 7c, shield 10 and cooling structure 12 to enable sensors (e.g., a temperature sensor 14) to monitor the condition (e.g., temperature) of the substrate 3. Additional measurement openings 13 may be provided to monitor the condition (e.g., temperature) of the substrate 3 at additional points. Preferably, the cooling structure 12 includes electrical control signals that can be programmed for temperature control and uniformity.

The cavities 15 in the lamp assemblies 2 may be filled with an anti-darkening agent (e.g., iodine, bromine or any halogen gas for use with tungsten) to minimize the darkening of the lamp assemblies 2 due to the evaporation of filament material (e.g., tungsten) from the filament 7 coating the inside of the plates 5. As a result, the filament surfaces last longer through a self-compensating process. The thinner the material the hotter locally a continuous current carrying material gets and the more rapid the deposition of filament material; thereby repairing thin spots.

Figure 2:
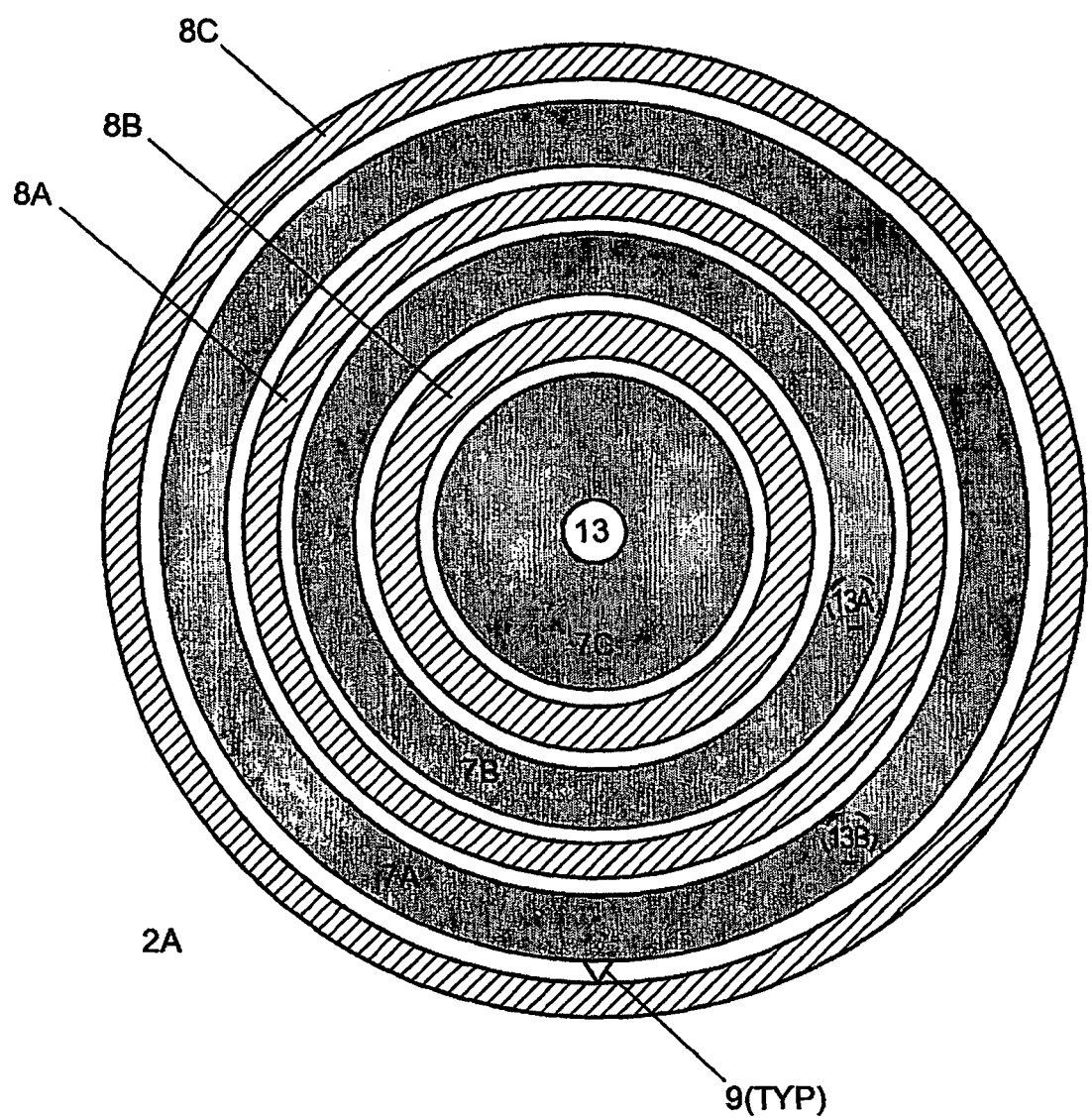
FIG. 2 is a top view of plural heating areas according to one aspect of the present invention.

FIG. 2 shows a top view of the lamp assembly 2a including the filament rings 7a, 7b, and 7c (separated by quartz spacers 8b and 8c) and a measurement opening 13. Such an opening need not be centered and is preferably located to optimize the monitoring of the substrate 3 temperature, for example as indicated by 13a and 13b.

The isolation plates 5 and 6 and the quartz separators 8a, 8b, and 8c are preferably fused together by fusion bonding. That is, a bonding layer (e.g., glass) with a suitable melting point is placed between all the connecting surfaces and then a sufficient amount of heat is applied to the layers to fuse them together. The filament rings 7 and the anti-darkening agent are preferably sealed inside the circular cavity spaces 15 at the same time. Alternatively, "tip offs" may be provided for evacuating the cavities 15, purging and cycle purging the cavities and then backfilling them with the anti-darkening agent.

The cavities 15 can be created in many ways, including but not limited to: (a) by fusing together an upper quartz plate, a lower quartz plate and several nested quartz ring separators; and (b) by fusing together an upper flat quartz plate and a lower quartz plate with machined multiple groove cavities on it. Moreover, the method of fusion is preferably performed under an atmosphere that contains the gas to be filled. For example, the fusing process is done inside a chamber that can be heated to fuse the system together while having the gases present.

The substrate-side plate 5 creates the structure for the RTP lamp 2 and acts as a vacuum window. Since the substrate-side plate 5 is made rigid and is sealed, it may act as its own vacuum window. This has an added advantage—because no additional vacuum window has to be added on the top of this lamp for it to be used in the semiconductor process, the radiation intensity from the heater source to the wafer is not reduced. The ribs of the spacers 8 also minimize the potentially large stresses on the structure. In general, the window preferably is flat, able to withstand the vacuum condition, and support a high radiant heat flux. Stresses sufficient to break the window may occur if the window is made too thick (enough to withstand the vacuum) and accordingly absorbs too much heat. Such a thickness results in a large thermal gradient through the window, and the gradient creates the stresses.

The coolant-side plate 6 provides the structure for the RTP lamp 2 and acts as a heat sink. This is accomplished by cooling the isolation plate either actively or passively.

Figure 3:
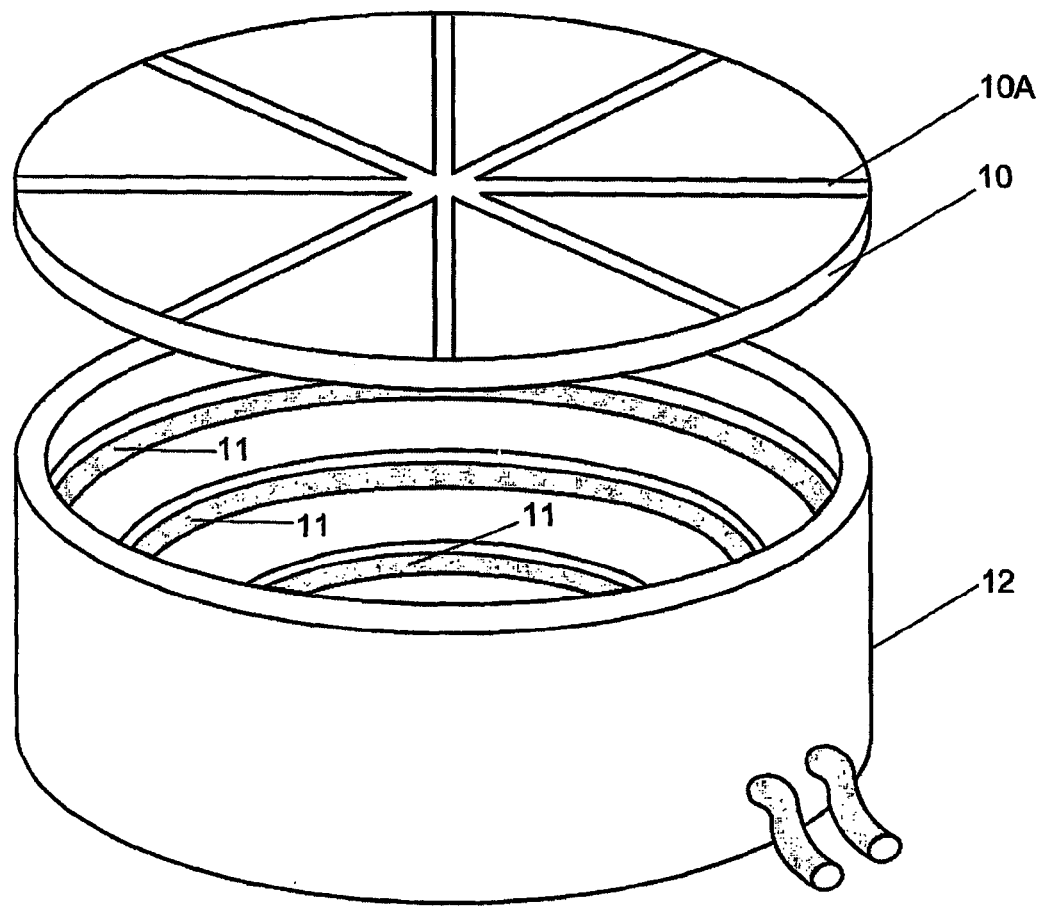
FIG. 3 is a side view of a stacked heater according to the present invention.

In a preferred embodiment, the filament rings 7 are not physically connected to any power supply or other filament rings. This reduces input/output failure due to metal to metal interface fatigue that commonly occurs in all the tungsten lamps. Preferably, the power in each of the rings 7 is delivered by induction using an inductively coupled power system. As shown in FIG. 3, this inductively coupled power system includes a shield 10 and an array of induction coils 11 placed opposite to the filament rings 7. The array is preferably placed on the outside of the quartz lamp assembly 2. Such induction coils 11 are then driven by a switching-mode RF power supply. By supplying RF power to the induction coils 11, inductive currents are generated individually and selectively in each of the filament rings 7 through those radial slots 10a in the shield 10.

In the preferred embodiment, the lamp 2 includes three separate circular zones that are separated by conductive boundaries. Power may be applied to each zone of the lamp 2 separately to maintain a uniform radiation field for heating the wafer. However, alternate numbers of zones and zone configurations are also possible according to the present invention. By selectively and independently controlling the power to the zones of lamps, the center-to-edge power distribution radiated from the lamps can be adjusted over time. If, in response to measurement of the wafer, there is a need to make the center and the edge different temperatures, this may be accomplished by adjusting the power input to each zone of lamps.

The cooling structure 12 is placed on the backside of the coolant side plate 6. The cooling structure 12 of FIG. 1 includes three grooves—one for each pair of induction coils 11 and filament rings 7—and preferably a measurement opening 13. The cooling structure 12 isolates the induction coils 11 to substantially reduce leakage of the induced fields from one coil to any of the filament rings 7 except for the one to which it is aligned. This structure is essentially like a mini-transformer with three primaries, each of these three primaries is inside its own Faraday cage. Each of these primaries will only couple power to its corresponding filament ring, which act as the secondaries of the transformer and the Faraday cage walls. 11. Each coil antenna 11 may be vertically displaced as shown in FIGS. 1 and 3, or they may all reside in the same horizontal plane.

Figure 5:
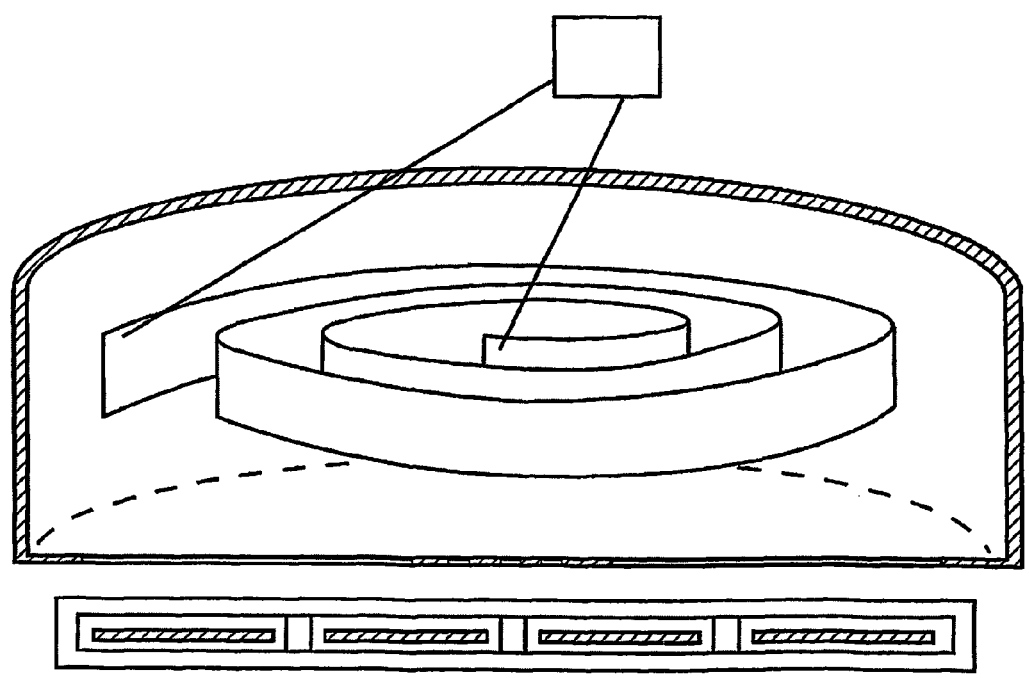
FIG. 5 is a partial top view of a heater according to a second embodiment of the present invention.

FIG. 5 presents a second embodiment for inductively coupling power to the filaments 7. It includes a rolled strip coil powered from a switching power supply. The AC power supply and coil antenna 11 should be designed for maximum power transfer coupling, i.e. maximum power coupling efficiency. The AC frequency or band of frequencies is inconsequential. In other words, a crude AC power source (crude relative to those required for RF power transfer in plasma processing devices) can be employed.

Alternate embodiments of heaters according to the present invention include (1) honeycombs of halogen lamps and (2) straight-line lamp arrays. By powering each lamp separately according to the present invention, the substrate to be processed can be heated more uniformly. Similarly, in yet another alternate embodiment, an external structure or plate (e.g., an external carbon structure) is inductively heated and then re-radiates heat to the wafer.

In fabricating a quartz-plate-based embodiment of the present invention, it is important to properly seal the plates together. If low melting point glass is used for bonding the quartz plates together, the different coefficients of thermal expansion between the bonds and the plates may cause stress fractures and/or warping.

In an alternate embodiment, the quartz plates are electrostatically bonded at very high temperatures. That is, with all the elements (e.g., the upper and lower quartz plates, the middle quartz separator rings, the filament rings inside cavity and the gases in the cavity) in place, a very high voltage is applied on the outside upper and lower quartz plates. All the plates are thus attracted together—tightly loading them. A diffusion bond is then made by melting a layer of the quartz at the interfaces at very high temperature to join the layers together. The diffusion bonding preferably uses interfaces that are free of debris, precisely aligned and in intimate contact.

In an alternate embodiment of the present invention, the lamp system is made as a decoupled system (e.g., using a wire sealing of the quartz plates at the outer edges). For example, a thick piece of quartz can be used to cover over and seal the lamp around the outside edge, followed by a wire seal to another piece that has the cavity in it. Attention should be given to cold areas that tend to condense out the anti-darkening agent and cool part of the filament rings, thereby stopping the halogen process. (In order for the halogen process to operate properly, the whole system has to be hot, around 800 C, including the wire connection points.)

In yet a further embodiment of the present invention, the RTP lamp is made as a detachable system of several separate parts (e.g., an upper flat quartz plate, a lower quartz plate with machined multiple circular groove cavities on it, filament rings, and support for the filament rings). Such a lamp can be disassembled after use or when the filament burns out. One such detachable system includes clamps/fasteners (e.g., stainless steel clamps with alumina faces) bolting together the layers that are sealed by a wire seal to hold the vacuum. At least one heater heats the outside edge to keep the wire seal warm. The lamp then can be turned on and off as usual. One advantage of such a configuration is that if the filament rings burn out or other elements are damaged, the lamp can be repaired quickly. The lamp is simply taken apart, the element is replaced, and the lamp is reassembled and resealed. This can be done as many times as needed as long as the halogen process is restarted again.

Figure 4:
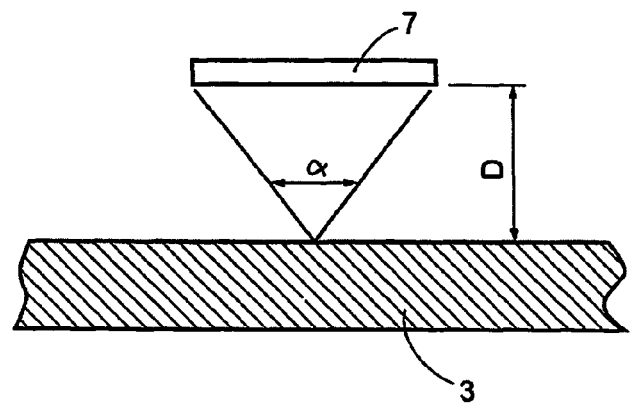
FIG. 4 is a conceptual diagram of an angle of illumination for an area according to the present invention.

As would be appreciated by one of ordinary skill in the art, a lamp according to the present invention preferably delivers to a wafer a power density having a high watts per square inch. Moreover, a large view factor lamp system may be placed very close to the wafer. As the view factor increases, the amount of the power needed drops dramatically. Accordingly, the zoning on the wafer becomes increasingly advantageous as the lamp is placed closer to the wafer. Generally, the view factor area of the filament at the wafer can be made arbitrarily large. As shown in FIG. 4, the view factor area is the area projected on the wafer by the solid angle ∝ of the filament. In other words, the view factor area is equal to the solid angle ∝ of the filament 7 multiplied by the distance, d, between the filament 7 and the wafer 3. The solid angle ∝ of the filament is the solid angle subtended by the filament when viewed from the wafer surface, which is determined by the dimension of the tungsten rings 7. By varying the design dimension of the filament rings 7, the increasingly large view factor helps to generate a uniform radiation field for heating the wafer.

In order to produce a properly tested filament ring (or coil), the present invention preferably utilizes an electronic test apparatus to confirm that the ring (or coil) will inductively receive RF energy. Such an apparatus is preferable to a DC test apparatus for the filament since the filament is not operated using DC power.

As a further testing mechanism, the present invention preferably includes a data measurement and storage system for relating applied RF power to output factors (e.g., heat generated, lamp startup). Such data can be used to inform a system operator if the lamp is operating out of its intended range.

In yet another alternate embodiment, the substrate to be processed is moveable while being heated in order to provide a changing and/or more uniform radiant heat flux across the substrate. The substrate may be rotated or translated (either vertically or horizontally).

Obviously, numerous modifications and variations of the present invention are possible in light of the above teachings. It is therefore to be understood that, within the scope of the appended claims, the invention may be practiced otherwise than as specifically described herein.

The invention claimed is:

1. A thermal processing equipment for heating a substrate, comprising:
    plural inductively coupled filaments including first and second inductively coupled filaments configured to heat the substrate via radiant heating while separated from the substrate by a gap and not physically connected to a power source; and
    at least one induction coil configured to inductively heat the first and second inductively coupled filaments.

2. The thermal processing equipment according to claim 1, wherein the substrate comprises a semiconductor wafer.

3. The thermal processing equipment according to claim 1, wherein the substrate comprises a liquid crystal display panel.

4. The thermal processing equipment according to claim 1, further comprising:
    plural AC power sources configured to selectively power the first and second inductively coupled filaments separately.

5. The thermal processing equipment according to claim 4, further comprising:
    an outer metal enclosure and a Faraday shield configured to block energy from one of the plural AC power sources from being coupled to the first inductively coupled filament while configured to allow the energy from the one of the plural AC power sources to be coupled to the second inductively coupled filament.

6. The thermal processing equipment according to claim 1, further comprising:
    plural cavities, between first and second isolation plates, configured to receive the plural inductively coupled filaments.

7. The thermal processing equipment according to claim 1, wherein the first inductively coupled filament comprises a tungsten filament.

8. The thermal processing equipment according to claim 1, wherein the first inductively coupled filament comprises a tungsten alloy filament.

9. The thermal processing equipment according to claim 1, wherein the at least one induction coil comprises plural induction coils including first and second induction coils, and the first and second induction coils are separated by an isolation feature so that the first and second induction coils independently and selectively heat the first and second inductively coupled filaments, respectively.

10. The thermal processing equipment according to claim 1, wherein the plural inductively coupled filaments are positioned to radiate only on one side of the substrate.

11. The thermal processing equipment according to claim 1, wherein the first inductively coupled filament is positioned to radiate on one side of the substrate, and the second inductively coupled filament is positioned to radiate on another side of the substrate.

12. The thermal processing equipment according to claim 1, further comprising:
    a shield provided with slots and positioned between the plural inductively coupled filaments and the at least one induction coil.

13. The thermal processing equipment according to claim 6, wherein one of the first and second isolation plates positioned between the plural inductively coupled filaments and the at least one induction coil is configured to be a shield which keeps excessive heat generated by the plural inductively coupled filaments from reaching the at least one induction coil, while permitting the at least one induction coil to inductively heat the plural inductively coupled filaments.

14. The thermal processing equipment according to claim 6, wherein one of the first and second isolation plates positioned between the plural inductively coupled filaments and the substrate is configured to be a vacuum window providing vacuum conditions for heating the substrate.

15. The thermal processing equipment according to claim 6, wherein the plural cavities are provided with spacers to separate the plural inductively coupled filaments.

16. A thermal processing equipment for heating a substrate, comprising:
    a first inductively coupled filament configured to heat the substrate;
    a first cavity, between first and second isolation plates, configured to receive the first inductively coupled filament; and
    hairpins configured to support the first inductively coupled filament away from the first and second isolation plates.

17. The thermal processing equipment according to claim 16, wherein the isolation plates comprise quartz plates.

18. The thermal processing equipment according to claim 16, wherein the isolation plates comprise frit bonded quartz plates.

19. The thermal processing equipment according to claim 16, wherein at least one of the isolation plates comprises a machined plate configured to form at least a portion of the first cavity.

20. The thermal processing equipment according to claim 16, wherein the cavity comprises an anti-darkening agent.

21. The thermal processing equipment according to claim 20, wherein the anti-darkening agent comprises iodine.

22. The thermal processing equipment according to claim 20, wherein the anti-darkening agent comprises bromine.

23. The thermal processing equipment according to claim 20, wherein the anti-darkening agent comprises a halogen gas.

24. The thermal processing equipment according to claim 16, further comprising:

a clamp configured to clamp the isolation plates together.

25. A thermal processing equipment for heating a substrate, comprising:

first and second heating means for heating the substrate via radiant heating while separated from the substrate by a gap;

coupling means for inductively coupling power to the first and second heating means in order to heat the heating means; and means for reflecting at least one of a light and a heat towards the substrate.

26. The thermal processing equipment according to claim 25, further comprising:

AC power supplying means for supplying power to the coupling means, said first and second heating means are not physically connected to said AC power supplying means nor to said coupling means.

27. The thermal processing equipment according to claim 25, wherein the substrate comprises at least one of a semiconductor wafer and a liquid crystal display panel.

28. The thermal processing equipment according to claim 25, further comprising:

AC power supplying means for selectively powering the first heating means and the second heating means separately.

* * * * *